(12) United States Patent
Mercer et al.

(10) Patent No.: US 6,738,006 B1
(45) Date of Patent: May 18, 2004

(54) DIGITAL/ANALOG CONVERTER INCLUDING GAIN CONTROL FOR A SUB-DIGITAL/ANALOG CONVERTER

(75) Inventors: Douglas A. Mercer, Bradford, MA (US); William G. J. Schofield, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/430,815

(22) Filed: May 6, 2003

(51) Int. Cl.[7] .............................................. H03M 1/66
(52) U.S. Cl. ......................................... 341/144; 341/145
(58) Field of Search ................................. 341/144, 145, 341/120, 136, 118

(56) References Cited

U.S. PATENT DOCUMENTS

| | | | | | |
|---|---|---|---|---|---|
| 5,828,329 | A | * | 10/1998 | Burns | 341/155 |
| 5,835,039 | A | * | 11/1998 | Giacomini | 160/178.1 R |
| 6,650,265 | B1 | * | 11/2003 | Bugeja | 341/144 |
| 6,674,377 | B1 | * | 1/2004 | Li | 341/120 |

* cited by examiner

Primary Examiner—Peguy JeanPierre
(74) Attorney, Agent, or Firm—Gauthier & Connors LLP (57) ABSTRACT

A digital to analog converter circuit is segmented into a main digital to analog converting unit including a plurality of current sources and a plurality of cascode units, each current source being connected to a cascode unit and a sub-digital to analog converting unit including a current source connected to a plurality of cascode units. A cascode bias unit is operatively connected to each cascode unit of the main digital to analog converting unit so as to bias each current source of the main digital to analog converting unit to operate at a same drain voltage. A second cascode bias unit is operatively connected to each cascode unit of the sub-digital to analog converting unit so as to bias the current source of the sub-digital to analog converting unit to operate at a same drain voltage. A reference voltage source is operatively connected to an input of the first cascode bias unit and connected to an input of the second cascode bias unit. The tying of the reference voltage source to both cascode bias circuits causes the operating emitter/source to collector/drain voltage of each current source transistor of the main digital to analog converting unit to be equal to the operating emitter/source to collector/drain voltage of the current source transistor of the sub-digital to analog converting unit.

19 Claims, 7 Drawing Sheets

DIGITAL/ANALOG CONVERTER INCLUDING GAIN CONTROL FOR A SUB-DIGITAL/ANALOG CONVERTER

FIELD OF THE PRESENT INVENTION

The present invention is directed to a digital to analog converter ("DAC") that includes a main section of the DAC to convert a most significant bit portion of the digital input and a sub-DAC to convert a least significant bit portion of the digital input. More particularly, the present invention is directed to a digital to analog converter ("DAC") that includes a main section of the DAC to convert a most significant bit portion of the digital input and a sub-DAC to convert a least significant bit portion of the digital input wherein a gain of the sub-DAC matches and tracks the gain of the main section of the DAC.

BACKGROUND OF THE PRESENT INVENTION

Figure 1:
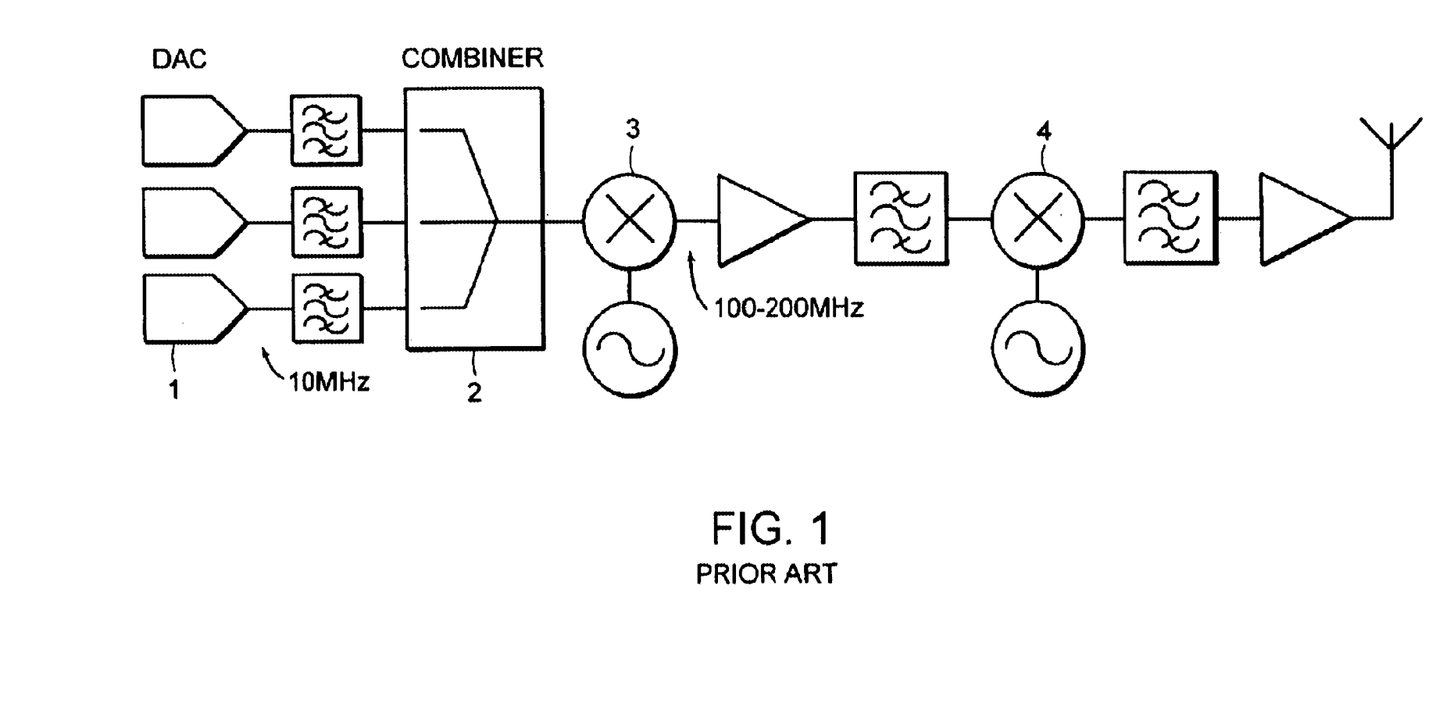
FIG. 1 is a block diagram of conventional multicarrier radio architecture.

Multicarrier radio architectures have conventionally used a single lower resolution digital to analog converter ("DAC") per carrier at a low baseband frequency followed by an analog channel combine and mix to an intermediate frequency ("IF") and then to a radio frequency ("RF"). FIG. 1 illustrates a simple block diagram showing a conventional transmit architecture.

As illustrated in FIG. 1, a plurality of DACs 1, each corresponding to a separate carrier, receives digital data and converts the received signal into analog signals. The analog signals are combined in combiner 2 prior to being mixed with an intermediate frequency by intermediate frequency mixer 3. Thereafter, the mixed signal is further mixed with a radio frequency by a radio frequency mixer 4. It would be desirable to use a single higher resolution digital to analog converter in this application. However, there have been limits to achieving the necessary resolution. It is the aim of the present invention to address one such limit.

Figure 2:
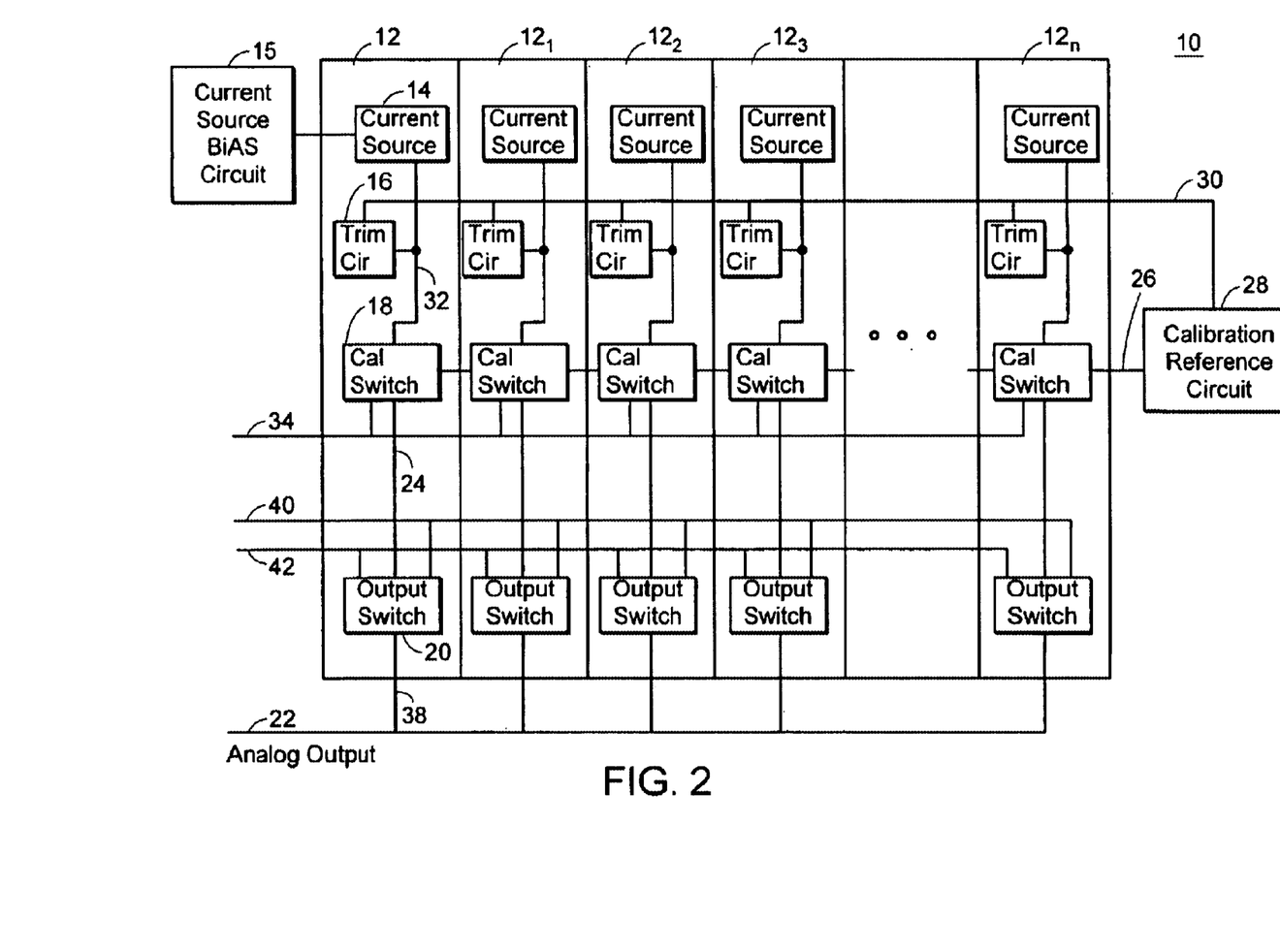
FIG. 2 is a schematic block diagram of a conventional digital to analog converter.

FIG. 2 illustrates an example of a conventional digital to analog converter 10 ("DAC 10") used in the low resolution DACs of FIG. 1. The DAC 10 includes a plurality of unit cells 12, 12$^I$ ... 12$^n$. Each cell, illustrated with respect to cell 12, includes a current source 14, a trim circuit 16, a calibration switch 18, and a current output switch 20. All of the output switches provide their analog outputs on the analog output network 22 where the analog outputs are summed.

Each calibration switch 18 connects a current source 14 either over line 24 to the associated output switch 20 or over line 26 to a calibration reference circuit 28. Calibration reference circuit 28 communicates over line 30 with each of the trim circuits 16 communicating to each of them the amount of current that must be added or subtracted to the output current on line 32 from current source 14 to ensure that the output current from each of the current sources 14 in each of the cells 12, 12$^I$, ... 12$_n$, are equal.

A control signal on line 34 sets calibration switch 18 either to the load mode where it connects current source 14 over line 24 to output switch 20 or over line 26 to calibration reference circuit 28 in the calibration mode. Each output switch 20 in addition to providing its output current on line 38 to analog output network 22 receives at its input data on lines 40 and 42.

Figure 3:
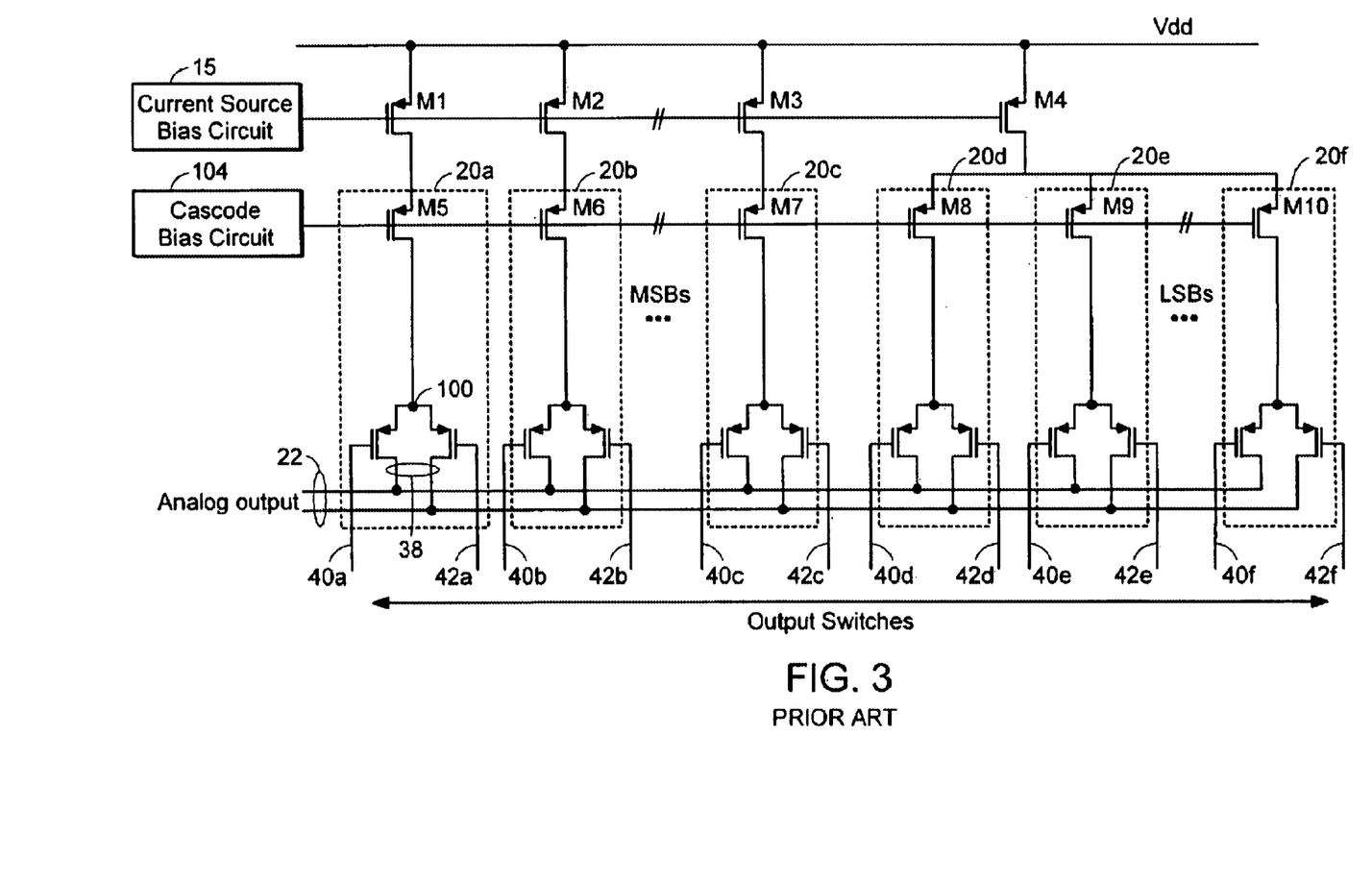
FIG. 3 is a detail schematic of the conventional digital to analog converter illustrated in FIG. 2.

FIG. 3 provides a more detail schematic of the digital to analog converter of FIG. 2. As illustrated in FIG. 3, an analog reference signal is fed to a plurality of current source transistors (M1, M2, ..., M3, M4). Each current source transistor (M1, M2, ..., M3, M4) is connected to current source bias circuit 15. As illustrated in FIG. 3, the digital signal is segmented between a most significant bit ("MSB") section and a least significant bit ("LSB") section, wherein the LSB section is a sub-DAC.

To implement this segmentation, the output of each current source transistor associated with the MSB section (in FIG. 3, these current source transistors are M1, M2, ..., M3) is connected to a digital to analog converter output switch (20a, 20b, ..., 20c). More specifically, the output of each current source transistor associated with the MSB section is connected to an isolation cascode transistor (M5, M6, ..., M7) within the respective digital to analog converter output switches (20a, 20b, ..., 20c).

Moreover, the output of the current source transistor associated with the LSB section (in FIG. 3, this current source transistor is M4) is connected to a plurality of digital to analog converter output switches (20d, 20e, ..., 20f). More specifically, the output of the current source transistor associated with the LSB section is connected to a plurality of isolation cascode transistors (M8, M9, ..., M10) within the respective digital to analog converter output switches (20d, 20e, ..., 20f).

Each isolation cascode transistor (MS, M6, ..., M7, M8, M9, ..., M10) is connected to cascode bias circuit 104. Moreover, each output switch (20a, 20b, ..., 20c, 20d, 20e, ..., 20f) in addition to providing output current on lines 38 to analog output network 22 receives at its input data on lines (40a, 42a, 40b, 42b, 40c, 42c, 40d, 42d, 40e, 42e, 40f, and 42f).

The approach illustrated in FIG. 1 has been conventionally utilized in view of the DAC's intermodulation distortion ("IMD") limiting the dynamic range of the DAC. However, as carriers are added, the peak power remains the same, but the average power reduces by 10-log (# of carriers). Moreover, as carriers are added, spectral emissions of the composite-multicarrier output must still be maintained on a per carrier basis, requiring a larger dynamic range from the DAC and thus the need for higher resolution. Furthermore, where large peak to average ratios are used it is possible, in some modulation schemes, for the absolute noise power spectral density ("NSD") of the DAC to limit the dynamic range of the DAC.

Therefore, it is desirable to provide a digital to analog converter that does not experience limitations to its dynamic range as carriers are added. In other words, it is desirable to provide a DAC wherein the DAC has IMD and NSD sufficient to meet multicarrier demands.

SUMMARY OF THE PRESENT INVENTION

A first aspect of the present invention is a digital to analog converter circuit. The digital to analog converter circuit includes a main digital to analog converting unit including a plurality of current sources and a plurality of cascode units, each current source being connected to a cascode unit; a sub-digital to analog converting unit including a current source connected to a plurality of cascode units; a first cascode bias unit, operatively connected to each cascode unit of the main digital to analog converting unit, to bias each current source of the main digital to analog converting unit to operate at a same drain voltage, a second cascode bias unit, operatively connected to each cascode unit of the sub-digital to analog converting unit, to bias the current source of the sub-digital to analog converting unit to operate at a same drain voltage; and a reference voltage source, operatively connected to an input of the first cascode bias unit and connected to an input of the second cascode bias unit, to cause the operating emitter/source to collector/drain voltage of each current source of the main digital to analog converting unit to be equal to the operating emitter/source to collector/drain voltage of the current source of the sub-digital to analog converting unit.

A second aspect of the present invention is a digital to analog converter circuit. The digital to analog converter circuit includes a main digital to analog converting unit including a plurality of current source transistors and a plurality of cascode transistors, each current source transistor being connected to a cascode transistor; a sub-digital to analog converting unit including a current source transistor connected to a plurality of cascode transistors; a first cascode bias unit, operatively connected to a control terminal of each cascode transistor of the main digital to analog converting unit, to bias each current source of the main digital to analog converting unit to operate at a same drain voltage; a second cascode bias unit, operatively connected to a control terminal of each cascode transistor of the sub-digital to analog converting unit, to bias the current source transistor of the sub-digital to analog converting unit to operate at a same source to drain voltage; and a reference voltage source, operatively connected to an input of the first cascode bias unit and connected to an input of the second cascode bias unit, to cause the operating emitter/source to collector/drain voltage of each current source transistor of the main digital to analog converting unit to be equal to the operating emitter/source to collector/drain voltage of the current source transistor of the sub-digital to analog converting unit.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention are not drawn to scale and that certain regions have been purposely drawn disproportionately so that the features and concepts of the present invention could be properly illustrated.

In the description below and in the claims, the term "emitter/source" refers to the emitter of a BJT device, the source of a MOSFET device, or the equivalents thereof. Moreover, in the description below and in the claims, the term "collector/drain" refers to the collector of a BJT device, the drain of a MOSFET device, or the equivalents thereof. Lastly, in the description below and in the claims, the phrase "emitter/source to collector/drain voltage" refers to the voltage across the emitter to the collector of a BJT device, the voltage across the source to the drain of a MOSFET device, or the equivalents thereof.

As noted above, in conventional DACs, as illustrated in FIG. 3, some number of equal (unit) current sources is created to represent some number of the most significant bits (MSBs). For high resolution DACs, the full resolution of the DAC is segmented into two or more groups of current sources of differing magnitudes. The first group represents the MSBs and the second group represents the LSBs In order to maintain a monotonic transfer function, the total current in the LSB segment must equal one of the unit currents in the MSB segment minus one LSB. One good way to insure this is to include an additional current source in the MSB array and use it to create the LSB currents, as illustrated in FIG. 3. The division of this current into the LSBs is most often done by a sub-DAC that serves to split or subdivide this MSB current into some number of (often equal) smaller currents.

All of these current sources (MSB and LSB) often also include a cascode device. This LSB sub-DAC often serves as both the cascode and current splitter. In order for the MSB currents to match the one used in the LSB DAC, when utilizing transistors with a finite output resistance such as BJT or MOSFET devices, the voltage across the emitter and collector or source and drain of all these devices, respectively, must be the same.

It would be most convenient if all the cascode devices could share the same base or gate bias voltage. This however puts a number of constraints on the range of device sizes one can use for the cascodes. It is desirable that the cascode devices in the MSB current sources are small, that is a short L (length) in the case of MOSFET devices.

On the other hand, again in the case of MOSFETs, it would be best if the sub-DAC devices were narrow and long for best linearity.

As will be seen from the various descriptions below, the present invention provides separate bias for the MSB cascodes and the LSB sub-DAC cascode. The separate biases track each other and insure that the proper source to drain voltage is maintained for all current source devices. By separating the biases, there is much less need to rely on device matching between MOS devices of vastly differing W (width) and L (length).

Figure 4:
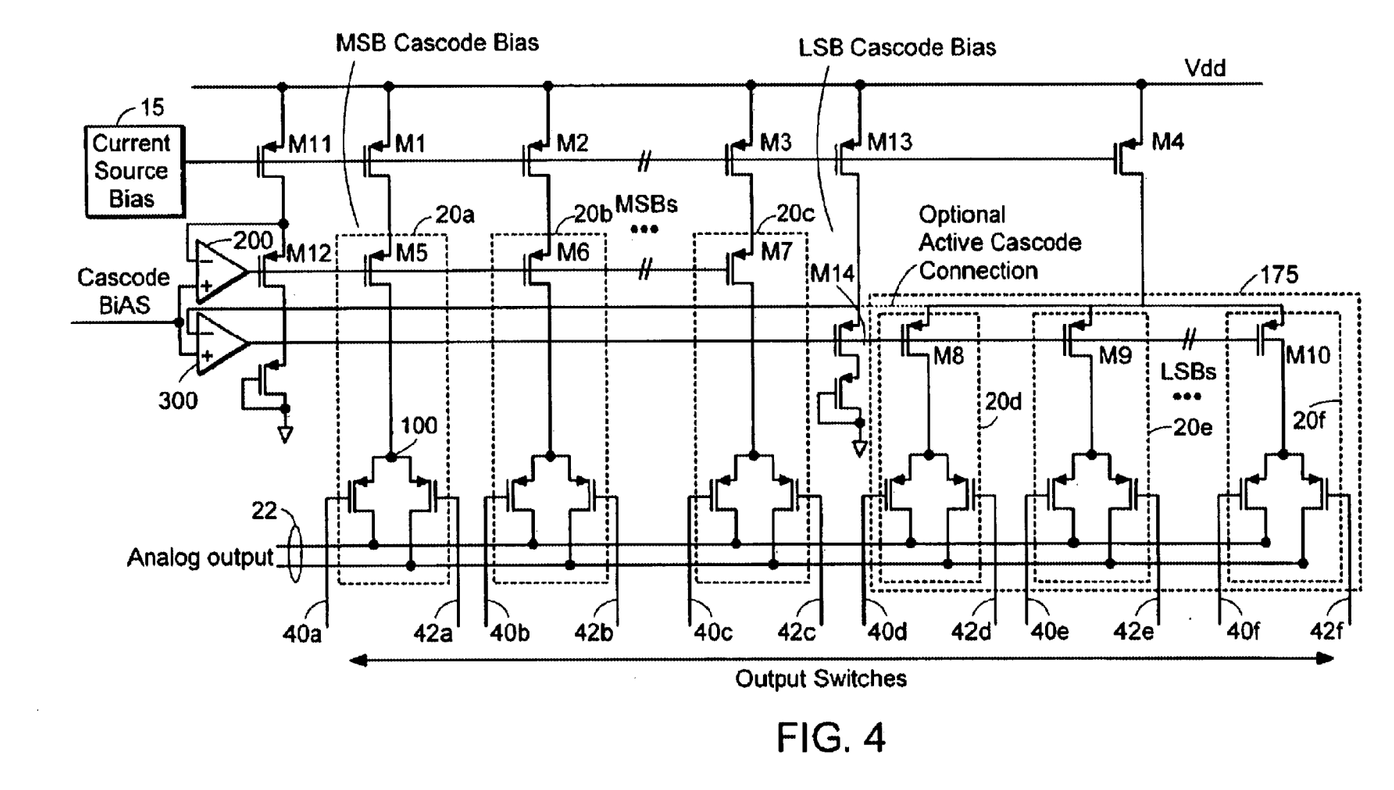
FIG. 4 is a detail schematic of a digital to analog converter according to the concepts of the present invention.

FIG. 4 illustrates another embodiment of a 16-bit digital to analog converter according to the concepts of the present invention. As illustrated in FIG. 4, an analog reference signal is fed to a plurality of current source transistors (M11, M1, M2, . . . , M3, M13, M4). Each current source transistor (M11, M1, M2, . . . , M3, M13, M4) is connected to current source bias circuit 15. As illustrated in FIG. 4, the output of each current source transistors associated with an MSB section (in FIG. 4, these current source transistors are M1, M2, . . . , M3) is connected to a digital to analog converter output switch (20*a*, 20*b*, 20*c*). More specifically, the output of each current source transistor associated with the MSB section is connected to an isolation cascode transistor (M5, M6, . . . , M7) within the respective digital to analog converter output switches (20*a*, 20*b*, 20*c*).

Moreover, the output of the current source transistor associated with the LSB section (in FIG. 4, this current source transistor is M4) is connected to a plurality of digital to analog converter output switches (20*d*, 20*e*, . . . , 20*f*). More specifically, the output of the current source transistor associated with the LSB section is connected to a plurality of isolation cascode transistors (M8, M9, . . . , M10) within the respective digital to analog converter output switches (20*d*, 20*e*, . . . , 20*f*).

The MSB isolation cascode transistors (M5, M6, . . . , M7) are connected to a first cascode bias circuit 200. The LSB isolation cascode transistors (M8, M9, . . . , M10) are connected to a second cascode bias circuit 300. The cascode bias circuits 200 and 300 are preferably operational amplifiers having their positive inputs tied to the same reference voltage source. The negative input of the first cascode bias circuit 200 is tied to the collector/drain of current source M11. On the other hand, negative input of the second cascode bias circuit 300 is tied to the collector/drain of current source M13, or optionally, tied to the collector/drain of current source M4.

Moreover, each output switch (20*a*, 20*b*, . . . , 20*c*, 20*d*, 20*e*, . . . , 20*f*) in addition to providing output current to analog output network 22 receives at its input data on lines (40*a*, 42*a*, 40*b*, 42*b*, 40*c*, 42*c*, 40*d*, 42*d*, 40*e*, 42*e*, 40*f*, and 42*f*).

Figure 5:
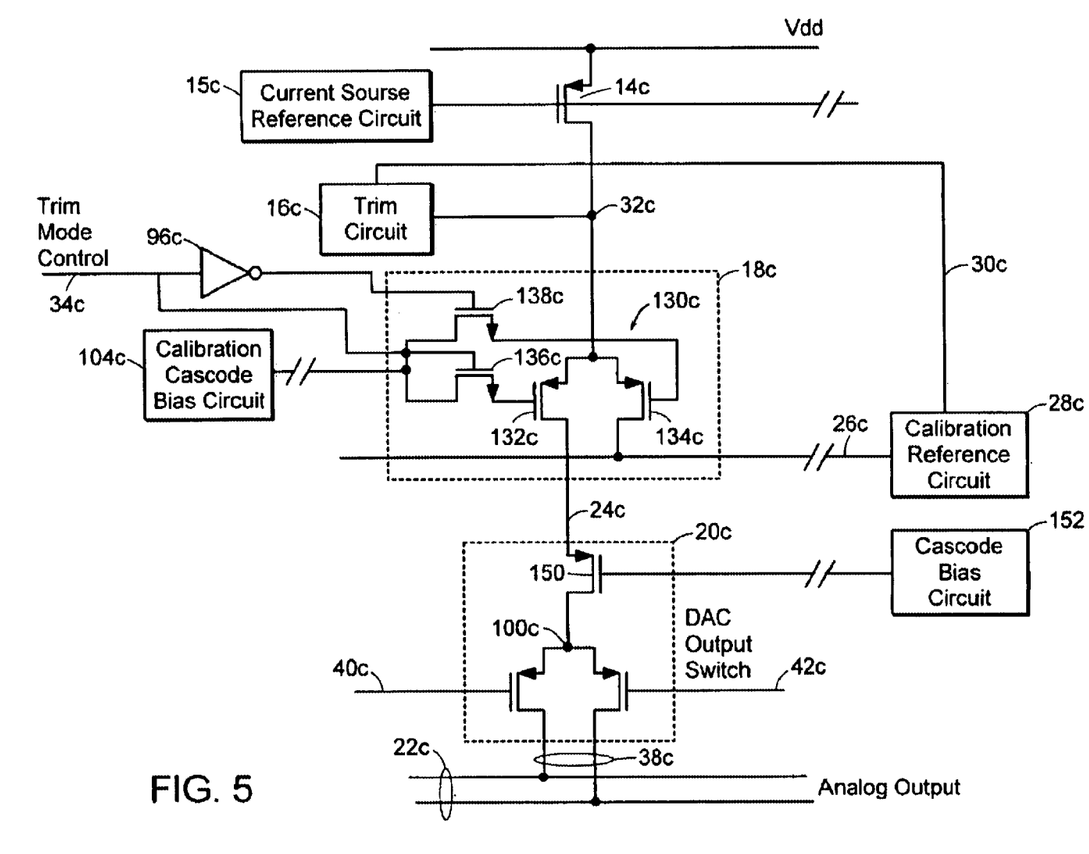
FIG. 5 is a detail schematic of a unit current cell of the digital to analog converter, as illustrated in FIG. 4, that further includes a calibrated current source according to the concepts of the present invention.

In another embodiment of the present invention, a calibration circuit is included. As illustrated in FIG. 5, in accordance with the concepts of the present invention, a calibration switch 18*c* includes cascode switch 130*c* including a pair of cascode switches 132*c* and 134*c* which in this case are implemented by P-MOSFETs. Although FET's have been used to implement all of the circuits of the present invention, it is noted that P-MOSFETs, N-MOSFETs, or bi-polar transistors may be used.

The calibration cascode bias circuit 104*c* provides the bias to turn on and off cascode switches 132*c* and 134*c* through switching circuits 136*c* and 138*c* and a trim mode signal is delivered on line 34*c* through inverter 96*c* to switches 136*c* and 138*c*. The cascode switches 132*c* and 134*c* maintain node 32*c* at a constant voltage and so there is a constant voltage across current source 14*c* regardless of in which mode the circuit is operating. As opposed to the prior art voltage mode switches, these cascode switches 132*c* and 134*c* maintain the same voltage on output current node 32*c* whether current source 14*c* is connected to the load, current switch 20*c*, or calibration reference circuit 28*c*. This ensures that the current measured during the calibration mode is an accurate replica of the current that actually flows to the load during the normal operation, and thus any trim current determined by calibration reference circuit 28*c* to be delivered by trim circuit 60*c* will be accurate, and result in a more accurate analog output on network 22*c*. Cascode switching circuit 130*c* thus provides isolation and requires minimum headroom providing two major advantages over the prior art.

An isolation cascode circuit 150 is provided included for output switch 20*c* in order to further isolate common source node 100*c* from output current node 32*c* so the perturbations occurring at common source node 100*c* either generated locally or reflected over the analog output network 22*c* do not reach current source 14*c*.

Or, if the perturbations occurring at common source node 100*c* do reach current source 14*c*, the perturbations reach current source 14*c* in diminished form as attenuated by the gain of isolation cascode circuit 150 in addition to the attenuation of the gain of the cascode switches 132*c* and 134*c*.

The cascode bias circuit 104*c* is constructed in a similar manner as illustrated in FIG. 4. More specifically, the cascode bias circuit 104*c* includes, preferably a pair of operational amplifiers having their positive inputs tied to the same reference voltage source. The negative input of a first operational amplifier is tied to the collector/drain of current source associated with MSBs. On the other hand, negative input of a second cascode operational amplifier is tied to the collector/drain of a current source associated with LSBs or a sub-DAC unit.

In a preferred embodiment of the present invention, it is noted that all MSB current sources are calibrated with the calibration circuit, guaranteeing 16-bit monotonicity. Each current is calibrated by switching it from the output to the input of a 6-bit successive approximation register (SAR) ADC that calibrates to the 18-bit level. The current source cascode is used to switch with a replica cascode connected to the SAR The replica cascode's gate is switched to the cascode gate rail ensuring the current source sees the same operating point during calibration and normal operation.

Figure 6:
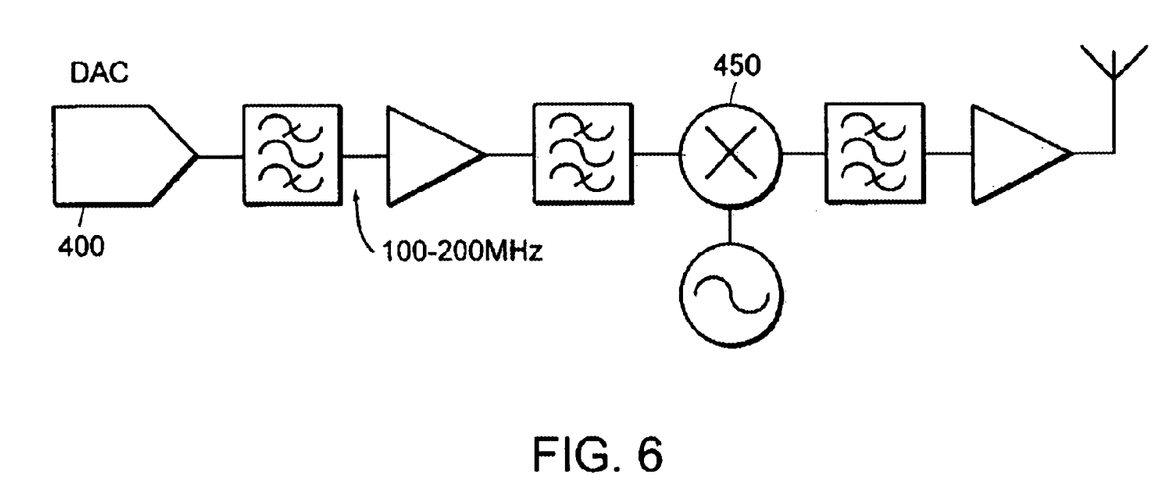
FIG. 6 is a block diagram of multicarrier radio architecture according to the concepts of the present invention.

Another advantage of utilizing the DACs of the present invention is that the multicarrier radio architecture can be simplified. Unlike the conventional architecture described above, multicarrier radio architecture can modified, according to the concepts of the present invention, so that it only requires the use of a single higher resolution digital to analog converter ("DAC") for all carriers. FIG. 6 illustrates a simple block diagram showing the radio architecture, according to the concepts of the present invention.

As illustrated in FIG. 6, a single DAC 400 receives digital data and converts the received signal into analog signals. The analog signals are mixed with a radio frequency by a radio frequency mixer 450. The architecture illustrated in FIG. 6 utilizes a DAC, according to the concepts of the present invention, having IMD and NSD sufficient to meet the multicarrier demands, removing the need for multiple lower resolution DACs and analog combiner, while also having the output frequency range to remove the conventional first IF mixing stage.

Figure 7:
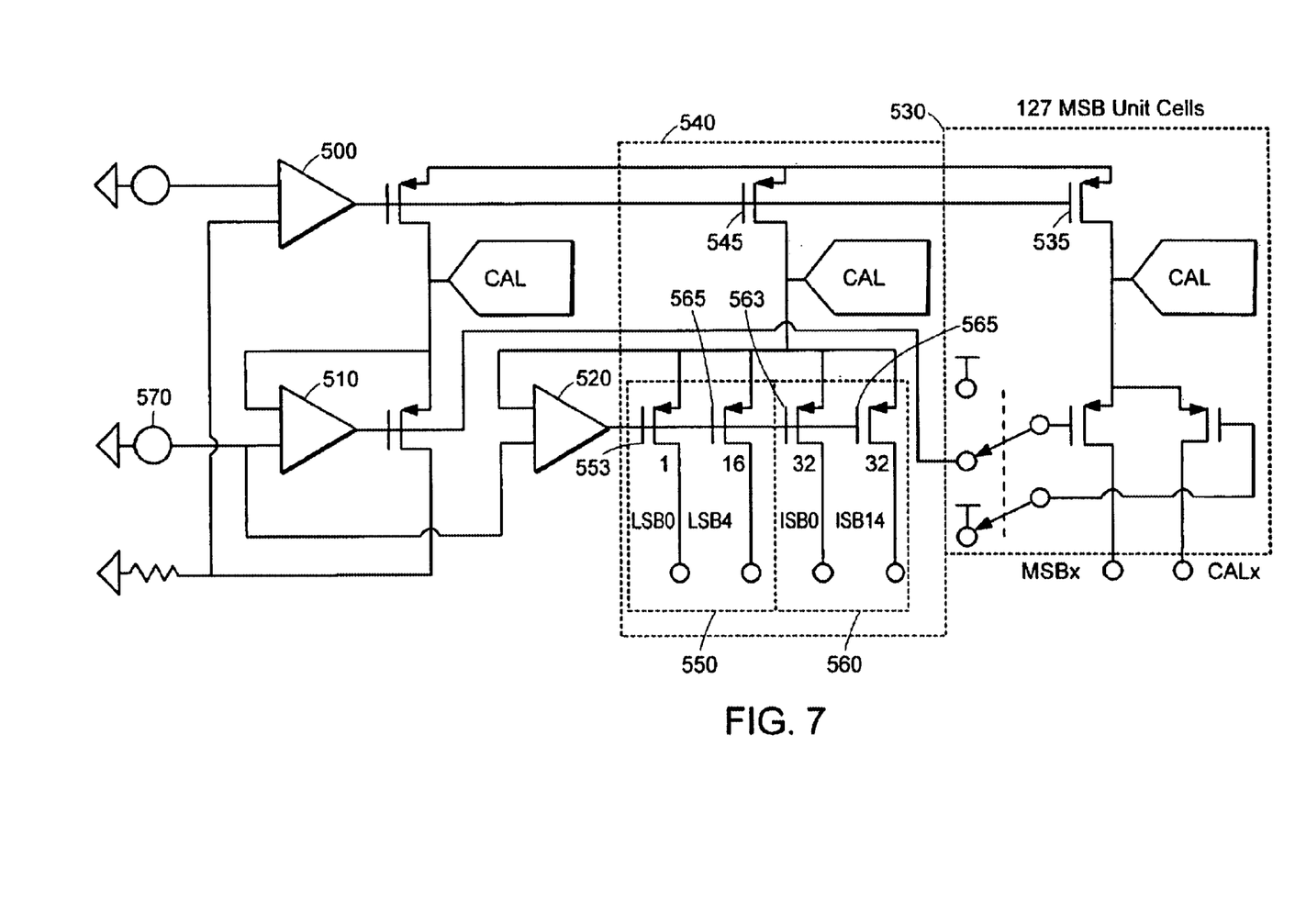
FIG. 7 is a block diagram of a digital to analog converter according to the concepts of the present invention.

FIG. 7 illustrates an example of a 16-bit digital to analog converter that can be used in the approach of FIG. 6 according to the concepts of the present invention. To reduce timing and amplitude mismatches, a preferred embodiment of the present invention, as illustrated by the 16-bit DAC of FIG. 7, utilizes a segmented architecture with a 127-element unary array 530 connected to a current source 535. The 127-element unary array 530 is used for the 7 MSBs.

The 16-bit DAC of FIG. 7 also includes an extra MSB current source 545 that is used for a 9-bit sub-DAC 540. The 9-bit sub-DAC 540 has a 15-element unary array 560 for the 4 intermediate significant bits ("ISBs") and a 5-bit binary array 550 for the LSBs.

As illustrated in FIG. 7, each MSB current is cascoded. A cascode gate rail is derived from a positive supply referred control operational amplifier 510.

The sub-DAC 540 uses a current-splitter in place of a MSB cascode. The current splitter includes binary weighted unit elements 553 and 555 for the LSBs and two 32-unit elements 563 and 565, one for each of the 15-ISBs. A separate control operational amplifier 520 drives the current splitter gate rail.

The control operational amplifier 520 and the control operational amplifier 510 use the same reference voltage source 570, but the control operational amplifier 520 closes the loop on the drain of the extra MSB current source 545. In this way the operating point of the extra MSB current source 545 matches the other MSB current source(s) 535, even though the effective cascode devices may have different operating points.

The 16-bit DAC of FIG. 7 further includes a current source bias circuit 500 connected to each of the current sources (545 and 535).

It is further noted that in the various embodiments described above, the LSB sub-DAC cascode could be of the active cascode variety.

In the sub-DACs described above, the sub-DAC, in a preferred embodiment, is a 9-bit sub-DAC made from an array of 512 unit transistors separate from the main MSB array. The unit transistors, at 6u wide by 5u long, are half as wide as the unit transistors in the MSB array. Moreover, in the preferred embodiment, the top 4 of the 9 bits are thermometer decoded with each segment composed of 16 pairs of 6/5 transistors.

The 5th bit is 8 pairs, the 6th bit 4 is pairs, and so forth down to a single pair for the 8th bit, and the LSB or 9th bit is a single 6/5 device.

So within the 9-bit sub-DAC, according to the concepts of the present invention, the 9-bit sub-DAC has all the currents scaled directly from the unit LSB size transistor. Such architecture insures good matching and linearity within the 9-bit sub-DAC.

As noted above, to insure that the gain of this sub-DAC matches and tracks the main MSB section, the sub-DAC of the present invention is fed with a current from the main array equal to an MSB segment. This enables the gain to be correct and allows the 512 unit transistors to divide the current up to make the lower bits.

As illustrated above in FIG. 3, by tying the common gate rail of the sub-DAC array to the same gate rail as the main MSB array and feeding the common source connection of the sub-DAC array with an equal set of 16 devices, the total current falls short of a MSB segment because the transistors in the main array are driven into the triode region where the cascodes keep the others a couple of hundred mV into the saturation region.

On the other hand, as illustrated in FIG. 4, by driving the common gate rail of the sub-DAC with another operational amplifier and using the transistors in the sub-DAC as a (very large) cascode, the present invention insures that the transistors from the main MSB array are operating at the identical emitter/source to collector/drain voltage as the MSB segments. In this way, the full-scale gain of the 9-bit sub-DAC is optimized.

It is further noted that the active cascodes used in each current segment leg of the DAC must now be biased at a slightly lower (~300 mV) voltage than the MSBs. This can be realized by generating another saturation bias voltage served off the main MSB section's bias voltage.

In summary, the present invention provides separate bias for the MSB cascodes and the LSB sub-DAC cascode. The separate biases track each other and insure that the proper emitter/source to collector/drain voltage is maintained for all current source devices. By separating the biases, there is much less need to rely on device matching between MOS devices of vastly differing W (width) and L (length).

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A digital to analog converter circuit, comprising:
   a main digital to analog converting unit including a plurality of current sources and a plurality of cascode units, each current source being connected to a cascode unit;
   a sub-digital to analog converting unit including a current source connected to a plurality of cascode units;
   a first cascode bias unit, operatively connected to each cascode unit of said main digital to analog converting unit, to bias each current source of said main digital to analog converting unit to operate at a same voltage;
   a second cascode bias unit, operatively connected to each cascode unit of said sub-digital to analog converting unit, to bias the current source of said sub-digital to analog converting unit to operate at a same voltage; and
   a reference voltage source, operatively connected to an input of said first cascode bias unit and connected to an input of said second cascode bias unit, to cause the operating emitter/source to collector/drain voltage of each current source of the main digital to analog converting unit to be equal to the operating emitter/source to collector/drain voltage of the current source of the sub-digital to analog converting unit.

2. The digital to analog converter circuit as claimed in claim 1, further comprising a current source bias circuit operatively connected to each current source of said main digital to analog converting unit and to the current source of said sub-digital to analog converting unit.

3. The digital to analog converter circuit as claimed in claim 1, wherein said sub-digital to analog converting unit converts the L least significant bits of N digital data bits into an analog signal.

4. The digital to analog converter circuit as claimed in claim 3, wherein said main digital to analog converting unit converts M bits of digital data into an analog signal, where the sum of M and L is equal to N.

5. The digital to analog converter circuit as claimed in claim 1, wherein said main digital to analog converting unit converts the M most significant bits of N digital data bits into an analog signal.

6. The digital to analog converter circuit as claimed in claim 1, wherein said first and second cascode bias units are operational amplifiers.

7. The digital to analog converter circuit as claimed in claim 6, wherein a positive input of said first cascode bias unit operational amplifier is operatively connected to said reference voltage source and a positive input of said second cascode bias unit operational amplifier is operatively connected to said reference voltage source to cause the operating voltage of each current source of said main digital to analog converting unit to be equal to the operating voltage of the current source of said sub-digital to analog converting unit.

8. The digital to analog converter circuit as claimed in claim 6, wherein a negative input of said second cascode bias unit operational amplifier is operatively connected to a collector/drain of a current source of said main digital to analog converting unit.

9. The digital to analog converter circuit as claimed in claim 6, wherein a negative input of said second cascode bias unit operational amplifier is operatively connected to a collector/drain of said current source of said sub-digital to analog converting unit.

10. The digital to analog converter circuit as claimed in claim 1, wherein said main digital to analog converting unit includes a plurality of calibration circuits, each calibration circuit being operatively connected between a current source of said main digital to analog converting unit and a cascode unit of said main digital to analog converting unit and said sub-digital to analog converting unit includes a calibration circuit, the calibration circuit being operatively connected between said current source of said sub-digital to analog converting unit and the cascode units of said sub-digital to analog converting unit.

11. A digital to analog converter circuit, comprising:
   a main digital to analog converting unit including a plurality of current source transistors and a plurality of cascode transistors, each current source transistor being connected to a cascode transistor;
   a sub-digital to analog converting unit including a current source transistor connected to a plurality of cascode transistors;
   a first cascode bias unit, operatively connected to the control terminal of each cascode transistor of said main digital to analog converting unit, to bias each current source transistor of said main digital to analog converting unit to operate at a same voltage;
   a second cascode bias unit, operatively connected to the control terminal of each cascode transistor of said sub-digital to analog converting unit, to bias the current source transistor of said sub-digital to analog converting unit to operate at a same voltage; and
   a reference voltage source, operatively connected to an input of said first cascode bias unit and connected to an input of said second cascode bias unit, to cause the operating emitter/source to collector/drain voltage of each current source transistor of the main digital to analog converting unit to be equal to the operating emitter/source to collector/drain voltage of the current source transistor of the sub-digital to analog converting unit.

12. The digital to analog converter circuit as claimed in claim 11, further comprising a current source bias circuit operatively connected to each current source transistor of said main digital to analog converting unit and to the current source transistor of said sub-digital to analog converting unit.

13. The digital to analog converter circuit as claimed in claim 11, wherein said sub-digital to analog converting unit converts the L least significant bits of N digital data bits into an analog signal.

14. The digital to analog converter circuit as claimed in claim 13, wherein said main digital to analog converting unit converts M bits of digital data into an analog signal, where the sum of M and L is equal to N.

15. The digital to analog converter circuit as claimed in claim 11, wherein said main digital to analog converting unit converts the M most significant bits of N digital data bits into an analog signal.

16. The digital to analog converter circuit as claimed in claim 11, wherein said first and second cascode bias units are operational amplifiers.

17. The digital to analog converter circuit as claimed in claim 16, wherein a positive input of said first cascode bias unit operational amplifier is operatively connected to said reference voltage source and a positive input of said second cascode bias unit operational amplifier is operatively connected to said reference voltage source to cause the operating voltage of each current source transistor of said main digital to analog converting unit to be equal to the operating voltage of the current source transistor of said sub-digital to analog converting unit.

18. The digital to analog converter circuit as claimed in claim 16, wherein a negative input of said second cascode bias unit operational amplifier is operatively connected to a collector/drain of a current source transistor of said main digital to analog converting unit.

19. The digital to analog converter circuit as claimed in claim 16, wherein a negative input of said second cascode bias unit operational amplifier is operatively connected to a collector/drain of said current source transistor of said sub-digital to analog converting unit.

* * * * *